US012433057B2

(12) United States Patent
Weng (10) Patent No.: US 12,433,057 B2
(45) Date of Patent: Sep. 30, 2025

(54) LEAD SALT THIN FILMS, DEVICES, AND METHODS OF MANUFACTURE

(71) Applicant: The Board of Regents of the University of Oklahoma, Norman, OK (US)

(72) Inventor: Binbin Weng, Norman, OK (US)

(73) Assignee: The Board of Regents of the University of Oklahoma, Norman, OK (US)

(*) Notice: Subject to any disclaimer, the term of this patent is extended or adjusted under 35 U.S.C. 154(b) by 597 days.

(21) Appl. No.: 17/796,125

(22) PCT Filed: Jan. 22, 2021

(86) PCT No.: PCT/US2021/014594
§ 371 (c)(1),
(2) Date: Jul. 28, 2022

(87) PCT Pub. No.: WO2021/154598
PCT Pub. Date: Aug. 5, 2021

(65) Prior Publication Data
US 2023/0087030 A1  Mar. 23, 2023

Related U.S. Application Data

(60) Provisional application No. 62/967,288, filed on Jan. 29, 2020.

(51) Int. Cl.
*H10F 30/21* (2025.01)
*G01J 1/58* (2006.01)
(Continued)

(52) U.S. Cl.
CPC ....... *H10F 77/127* (2025.01); *H10F 77/1228* (2025.01); *H10F 77/124* (2025.01); *H10K 30/00* (2023.02)

(58) Field of Classification Search
CPC .. H10F 77/127; H10F 77/1228; H10F 77/124; H10K 30/50
See application file for complete search history.

(56) References Cited

U.S. PATENT DOCUMENTS 10,107,751 B2  10/2018  Sherer et al.
2006/0285114 A1* 12/2006 Cao ................... G01N 21/3504
356/440

(Continued)

OTHER PUBLICATIONS

Templeman, Tzvi and Biton, Moshiel and Safrani, Tsofnat and Shandalov, Michael and Yahel, Eyal and Golan, Yuval, Chemically deposited PbSe thin films: factors deterring reproducibility in the early stages of growth, 2014, CrystEngComm, 16, 10553-10559 (Year: 2014).*

(Continued)

*Primary Examiner* — Yara B Green
*Assistant Examiner* — Coralie A Nettles
(74) *Attorney, Agent, or Firm* — Conley Rose, P.C.

(57) ABSTRACT

A method of manufacturing a lead salt thin film on a substrate by seeding a substrate with a lead salt solution (e.g., PbSe, PbS, or PbTe) to form a seeded substrate comprising lead salt seed crystals, and growing the lead salt thin film upon the substrate by exposing the seeded substrate to a chemical bath comprising the lead salt solution at a predetermined growth temperature. A lead salt thin film manufactured by the process. A photonic crystal microchip comprising the lead salt thin film. A gas sensing device comprising a diode laser, a mid-infrared photodetector, and the photonic crystal microchip. A method of detecting a hydrocarbon gas, comprising exposing a gas sample to the gas sensing device, and determining the content of hydrocarbon gases in the gas sample.

17 Claims, 3 Drawing Sheets

(51) Int. Cl.
  *H10F 71/00*   (2025.01)
  *H10F 71/10*   (2025.01)
  *H10F 77/12*   (2025.01)
  *H10F 77/122*  (2025.01)
  *H10F 77/124*  (2025.01)
  *H10K 30/00*   (2023.01)

(56) References Cited

U.S. PATENT DOCUMENTS

2014/0252529 A1* 9/2014 Shi .................. H10F 30/10
                                                  252/519.4
2017/0152608 A1* 6/2017 Jin .................. H10K 71/12

OTHER PUBLICATIONS

Yan, Long, Zhang, Yu, Zhang, Tieqiang, Feng, Yi, Zhu, Kunbo, Wang, Dan, Cui, Tian, Yin, Jingzhi, Wang, Yiding, Zhao, Jun, Yu, William, Tunable near-Infrared Luminescence of PbSe Quantum Dots for Multigas Analysis, 2014, Analytical Chemistry, 86, 11312-11318 (Year: 2014).*

A.N. Chattarki, S.S. Kamble, L.P. Deshmukh, Role of pH in aqueous alkaline chemical bath deposition of lead sulfide thin films, 2011, Materials Letters, 67, 39-41 (Year: 2011).*

Hajar Farshidi, Amir Ali Youzbashi, Mehdi Heidari Saani, Alimorad Rashidi & Asghar Kazem Zadeh, Control of morphology and optical properties of PbS nanostructured thin films by deposition parameters: study of mechanism, 2016, Experimental Nanoscience, 11, 1416-1425 (Year: 2016).*

Chattarki, A.N., et al.; "Role of pH in aqueous alkaline chemical bath deposition of lead sulfide thin films"; Materials Letters 67 (2012) 39-41.

Farshidi, H., et al.; "Control of morphology and optical properties of PbS nanostructured thin films by deposition parameters: study of mechanism"; Journal of Experimental Nanoscience 11:18 (2016) 1416-1425.

Goyal, A.K.; et al.; "Recent advances and progress in photonic crystal-based gas sensors"; J. Phys. D: Appl. Phys. 50 (2017) 203001; 16 pages.

Jang, J.W., et al.; "Effective two-step chemical deposition for homogeneous lead sulfide thin films on a flexible polymer substrate"; Thin Solid Films 679 (2019) 1-7.

PCT/US2021/014594; "International Search Report and Written Opinion"; May 18, 2021; 11 pages.

* cited by examiner

LEAD SALT THIN FILMS, DEVICES, AND METHODS OF MANUFACTURE

CROSS-REFERENCE TO RELATED APPLICATIONS

This is a National Stage of Int'l Patent App. No. PCT/US2021/014594, filed Jan. 22, 2021, which claims priority to U.S. Prov. Patent App. No. 62/967,288, filed Jan. 29, 2020, both of which are incorporated herein by reference.

BACKGROUND

The mid-infrared (MIR) spectral region covering wavelengths from 2 µm to 20 µm, contains fundamental molecule vibration signatures of almost all molecules as well as two atmospheric transmission windows of 3-5 µm and 8-12 µm, and thus has a significant importance for a wide variety of sensing applications in medical diagnosis, environment protection, national security and defense, and industry process control fields. Various MIR sensing techniques have been explored through interacting light with molecules mainly based on the Beer-Lambert's law. These kinds of sensing technologies have demonstrated very good stability, selectivity and sensitivity performance, and therefore have been used more and more commonly.

With the emerging internet of things (IoTs)-based technology framework, there has been a global trend in device miniaturization for the integration with smartphones, tablets and wearable consumer electronics. Numerous efforts have been made in order to develop a transformative on-chip MIR sensor in recent years. As a result, performance of active MIR light sources and photodetectors have been improved. MIR laser sources (i.e., quantum cascade lasers (QCLs) and interband cascade lasers (ICLs)) able to operate at room temperature (RT) have been successfully realized on III-V group semiconductor materials platforms. In the wavelength range from 3 to 5 µm, the specific detectivity (D*) of MIR photodetectors has reached $4 \times 10^{12}$ Jones using IV-VI group lead-salt semiconductors. For longer wavelength ranges, improvements on the miniaturization for pyroelectric and thermopile detectors have also contributed to the reduction of price and footprint.

However, those technology advancements still have not been able to reach the complete on-chip integration of a practical MIR chemical sensor. Apparently, quantum engineered III-V MIR lasers offer incomparable performance and dominate light source markets for MIR sensing applications. But also because of that, cost and integration challenges have been preventing the sensor development progress. Both QCLs and ICLs are made of precisely controlled quantum-well and super-lattice structures, which require the use of expensive and time-consuming molecular beam epitaxy (MBE) ultra-high vacuum growth process. The room to reduce such cost is marginal. On the other hand, materials and substrates for low-cost non-cryogenic MIR photodetectors (PbSe, HgCdTe, etc.) are different from the ones for QCLs/ICLs. Consequently, monolithic integration of key elements (laser, photodetector and gas cell) becomes almost impossible.

Figure 1:
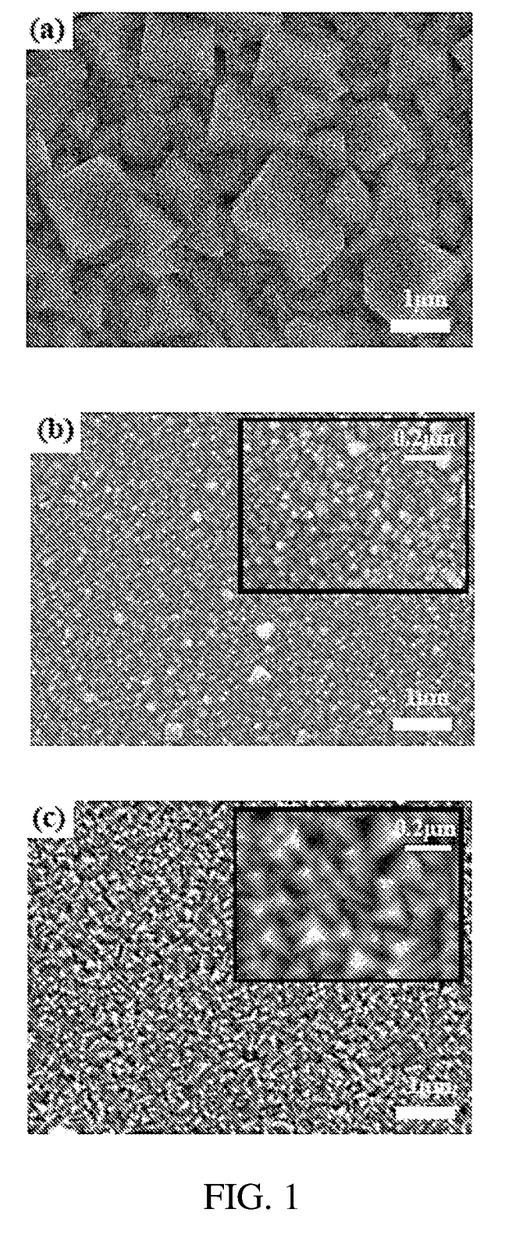
FIG. 1 shows top view scanning electron microscope (SEM) images of lead-selenide (PbSe) thin film samples prepared by (a) a poly-crystalline high-temperature bath deposition, (b) a low-temperature quantum dots deposition, and (c) modified oriented-attachment nanocrystal growth method. The insets of (b) and (c) are ×5 zoom-in images of the corresponding samples.

A structural zone model (SZM) was recently reported (Templeman, T., Sengupta, S., Maman, N., Bar-Or, E., Shandalov, M., Ezersky, V., Yahel, E., Sarusi, G., Visoly-Fisher, I., and Golan, Y., 2018, "Oriented attachment: a path to columnar morphology in chemical bath deposited pbse thin films," *Crystal Growth & Design* 18(2), 1227-1235) which depicts an intermediate oriented attachment growth mechanism between ion-by-ion and cluster growth modes (FIG. 1). This mechanism can produce highly uniformly (111) oriented PbSe microstructure films exhibiting low dimension quantum confinement effects covering a broad MIR wavelength range from bulk 4.2 µm down to the near infrared (NIR) range. However, this result can only be realized by using an epi-polished single crystal GaAs substrate. It was further reported that "a high pH is required to initiate strong complexation of lead with hydroxide and to avoid elemental Se decomposition from selenosulfate" (Templeman, T., Biton, M., Safrani, T., Shandalov, M., Ezersky, V., Yahel, E., and Golan, Y., 2014, "Chemically deposited PbSe thin films:factors deterring reproducibility in the early stages of growth," *Cryst Eng Comm.* 16, 10553-10559) and high pH is indicated as pH>13. In regard to photonic waveguide applications, high dielectric index GaAs substrate could cause a large optical leakage to affect the photonic performance negatively. Also, the high substrate cost is another concern.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting of the scope of the inventive concepts disclosed herein. The figures are not necessarily to scale and certain features and certain views of the figures may be shown as exaggerated in scale or in schematic in the interest of clarity and conciseness.

DETAILED DESCRIPTION

Disclosed herein is a new method for growth of smooth grain-size tunable nanocrystalline lead salt thin films on substrates. Traditional wet chemical growth methods only produce rough and non-oriented PbS, PbSe, and PbTe thin films, and their crystal size varies in a broad range within the same film, which make the films virtually unusable for micro/nanophotonic devices (e.g., photonic crystals) that require a very precise definition of the structure morphology. By using this new hybrid chemical method, the as-grown thin film is assembled by uniformed and columnized nanocrystal grains well-aligned in (111) orientation, which leads to an ultra-smooth surface morphology as well as controllable quantum photonic properties. At least two aspects of the method are novel, including (1) using a PVD process to form a seed layer to provide dense seeding sites that enable a quick and uniform growth process in the second chemical deposition step, and (2) using a narrow window of growth conditions (e.g., pH<12) for the CBD step. None of the reported CBD method can grow (111) oriented PbS, PbSe, and PbTe thin films with controlled nanocrystal size.

Mid-infrared (mid-IR) gas sensing technology has been widely received as a competitive choice for the newly emerging internet-of-things (IoTs) applications mainly due to its high sensitivity, selectivity and reliability. However, high cost and chip-integration challenges, on the contrary, still limits their potential development. Disclosed herein are thin films comprising lead-salt materials (e.g., PbS, PbSe, PbTe) for addressing these issues. Described herein are methods of preparing lead-salt based high quality active MIR photonic materials. Using a modified oriented-attachment synthesis method, for the first time, PbS, PbSe, PbTe thin films grown on amorphous glass substrates in the wet chemical process, presented a highly smooth surface having a uniformed crystal orientation in the (111) direction. Further, their nanocrystal size can also be tailored to allow a broad range control of emission wavelength from 3.3 µm to 4.2 µm owing to the unique quantum size effects. These new materials and processes provide a cost-effective path to conduct active photonic waveguide engineering to manipulate light-and-matter interactions in the MIR range for chip-integrated sensing applications (e.g., IoTs), such as, but not limited to, on-chip gas sensors. This group of direct narrow band semiconductors have high optical absorption coefficient and extremely low non-radiative Auger recombination rates. By far, uncooled polycrystalline PbSe photoconductive detectors remain the major choice for MIR sensing applications operating in the 3-5 µm spectral range thanks to their high detection performance. Besides, they have very good light emitting capabilities, especially at room temperature conditions. Using the presently disclosed materials, it is possible to fabricate both light source and photodetector on one substrate for monolithic integration purposes. In addition, lead salts also have highest refractive indices compared with other MIR material groups. This is a unique and outstanding property for confining light in active waveguides to manipulate light and matter interactions. Thus, besides the emitters and detectors, the lead-salt waveguide offers another key component for sampling gas molecules on chips. With all these factors being considered, it is very promising to develop sensing device in one chip based on lead-salt materials. Nevertheless, it is necessary to point out that, in order to conduct photonic design, the material morphology and geometry has to be well defined. However, polycrystalline lead salt materials prepared by the previous wet chemical process on amorphous substrates generally result in random crystal orientations and have a very rough surface morphology comparable with the corresponding MIR wavelengths. To overcome this technical hurdle, presented in the present disclosure are results for preparing highly uniform and oriented lead-salt photonic nanocrystal films on glass substrates using a new hybrid wet chemical synthesis approach.

Before further describing various embodiments of the apparatus, compositions and methods of the present disclosure in more detail by way of exemplary description, examples, and results, it is to be understood that the embodiments of the present disclosure are not limited in application to the details of apparatus, methods and compositions as set forth in the following description. The embodiments of the apparatus, compositions and methods of the present disclosure are capable of being practiced or carried out in various ways not explicitly described herein. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description. While the apparatus, compositions and methods of the present disclosure have been described in terms of particular embodiments, it will be apparent to those of skill in the art that variations may be applied to the apparatus, compositions and/or methods and in the steps or in the sequence of steps of the method described herein without departing from the concept, spirit, and scope of the inventive concepts as described herein. All such similar substitutes and modifications apparent to those having ordinary skill in the art are deemed to be within the spirit and scope of the inventive concepts as disclosed herein.

All patents, published patent applications, and non-patent publications referenced or mentioned in any portion of the present specification are indicative of the level of skill of those skilled in the art to which the present disclosure pertains, and are hereby expressly incorporated by reference in their entirety to the same extent as if the contents of each individual patent or publication was specifically and individually incorporated herein.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

As utilized in accordance with the methods and compositions of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the terms "about" or "approximately" are used to indicate that a value includes the inherent variation of error for the apparatus, composition, or the methods or the variation that exists among the objects, or study subjects. As used herein the qualifiers "about" or "approximately" are intended to include not only the exact value, amount, degree, orientation, or other qualified characteristic or value, but are intended to include some slight variations due to measuring error, manufacturing tolerances, stress exerted on various parts or components, observer error, wear and tear, and combinations thereof, for example. The terms "about" or "approximately", where used herein when referring to a measurable value such as an amount, percentage, temporal duration, and the like, is meant to encompass, for example, variations of ±20% or ±10%, or ±5%, or ±1%, or ±0.1% from the specified value, as such variations are appropriate to perform the disclosed methods and as understood by persons having ordinary skill in the art. As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, a range of 1-1,000 includes, for example, 1-10, 10-20, 20-30, 30-40, 40-50, 50-60, 60-75, 75-100, 100-150, 150-200, 200-250, 250-300, 300-400, 400-500, 500-750, 750-1,000, and includes ranges of 1-20, 10-50, 50-100, 100-500, and 500-1,000. The range 100 units to 2000 units therefore refers to and includes all values or ranges of values of the units, and fractions of the values of the units and integers within said range, including for example, but not limited to 100 units to 1000 units, 100 units to 500 units, 200 units to 1000 units, 300 units to 1500 units, 400 units to 2000 units, 500 units to 2000 units, 500 units to 1000 units, 250 units to 1750 units, 250 units to 1200 units, 750 units to 2000 units, 150 units to 1500 units, 100 units to 1250 units, and 800 units to 1200 units. Any two values within the range of about 100 units to about 2000 units therefore can be used to set the lower and upper boundaries of a range in accordance with the embodiments of the present disclosure. More particularly, a range of 10-12 pH units includes 10, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8. 11.9, and 12.0, and all values or ranges of values of the units, and fractions of the values of the units and integers within said range, and ranges which combine the values of the boundaries of different ranges within the series, e.g., 10.1 to 11.5.

Returning now to the various embodiments disclosed herein, several non-limiting examples will be described and discussed.

The hybrid process disclosed herein involves the use of physical vapor deposition (PVD) and the chemical bath deposition (CBD). PVD is adopted to create a highly dense seed layer whose thickness can vary, for example, from 10-50 nm. The PVD method can be, in non-limiting embodiments, thermal evaporation, radio frequency (RF) sputtering deposition, or molecular beam epitaxy (MBE) process. The substrates (wafer) used herein may be selected from, but are not limited to, glass, silicon, oxide on silicon, GaAs, InP, or a metal. The substrate may be flat or curved. Before the growth, they may be cleaned in solvent and acid baths sequentially. After the PVD deposition, the wafer with a thin seed layer will be transferred into a chemical bath to grow the (111) oriented nanocrystalline thin film. This step is known as chemical bath deposition (CBD). The chemical reaction agents may include lead-acetate, sodium selenosulfate, sodium hydroxide or potassium hydroxide, and water. During this second growth process, chemical bath deposition is formulated within a small growth window in which both pH value, growth temperature and growth time are precisely controlled. While controlling the size of the nanocrystalline, to allow the thick film deposition on the substrate, multiple wet-chemical grow cycles may be needed.

EXAMPLES

The embodiments of the present disclosure will be more readily understood by reference to the following examples, which are included merely for purposes of illustration of certain aspects and embodiments of the inventive concepts and are not intended to be limiting. The following examples and methods describe how to make and use the various embodiments of the present disclosure and are to be construed, as noted above, only as illustrative, and not limitations of the disclosure in any way whatsoever. Those skilled in the art will promptly recognize appropriate variations from the components, materials and procedures described herein.

Materials and Methods

Sodium sulfite (Aldrich, BioUltra, anhydrous, ≥98%), selenium powder (Aldrich, 100 mesh, 99.99%), lead (II) acetate trihydrate (Aldrich, ≥99.99%), and sodium hydroxide (pellets EMPLURA). A stock of sodium selenosulfate ($Na_2SeSO_3$), 0.2 M, was prepared by re-fluxing 0.2 M of selenium powder with 0.5 M of sodium sulfite. Glass slide substrates were thoroughly cleaned by soaking in solvent and RCA baths sequentially, and then washed in de-ionized water and purge-dried by $N_2$ gas. To prevent large precipitating particles from contaminating the growing film, the deposition side of the glass substrate was facing downwards, at an angle of about 70° with respect to the air-solution interface. The solution was prepared by diluting the lead acetate solution with water and adjusting the pH with sodium hydroxide to a range between 10-12, for example between 10-11. Finally, $Na_2SeSO_3$ was added to a 50 ml Pyrex beaker to initiate the growth.

The surface morphologies of the as-grown thin films were characterized by using a Jeol JSM-6060 scanning electron microscopy (SEM) tool. Structural analysis was performed by using a Rigaku Ultima IV X-ray diffractometer (XRD) tool. The XRD data were collected over a 2θ range of 10° to 70° using Cu Kα radiation (λ=1.5405 μm at 40 kV. In photoluminescence (PL) measurements of the materials, a near IR diode laser operating at 980 nm was used as an optical excitation source. The PL signals were then collected by a Bruker Invenio-R Fourier transform infrared Spectrometer using a high-gain cryogenic-cooled InSb photodetector. In addition, an amplitude lock-in approach was adopted in the PL measurement to suppress the background interference (e.g., ambient thermal radiation).

In one non-limiting embodiment, the process for manufacturing the thin film includes (1) seeding the substrate (e.g., via PVD or wet chemical deposition) at a high temperature (in a range of 60° C. to 95° C., e.g., 70° C. to 80° C.) for 1 to 5 minutes, at a pH in a range of 10-12, e.g., 10-11, and (2) transferring the seeded substrate to a water bath at a medium temperature (in a range of 50° C. to 65° C., e.g., 50° C. to 60° C.) for 1 to 15 minutes for CBD of the thin film on the substrate. The process is run at a pH in a range of 10-12, e.g., 10-11.

Nanocrystal sizes can be tuned to have specific emission wavelengths, e.g., in a range between 3.2 μm and 4.2 μm. For example, crystal size can be made smaller by processing at a temperature in the lower end of the range and by reducing the processing time in the second (growth) step.

Results

Lead salts have various growth mechanisms in the chemical synthesis process. Two of the most commonly reported and thoroughly investigated mechanisms that could lead to film-to-substrate deposition are the ion-by-ion growth and the cluster growth mechanisms. The ion-by-ion mode is a simple deposition process in which a chemical reaction happens upon the substrate surface directly. This mechanism typically results in bulk films with irregular orientations. The cluster growth mode refers to a two-step process that solid clusters precipitate in solution and then diffuse to the substrate and assemble together into the nanocrystal forms. This mode could produce highly-dense and ultra-small quantum dot films.

Figure 2:
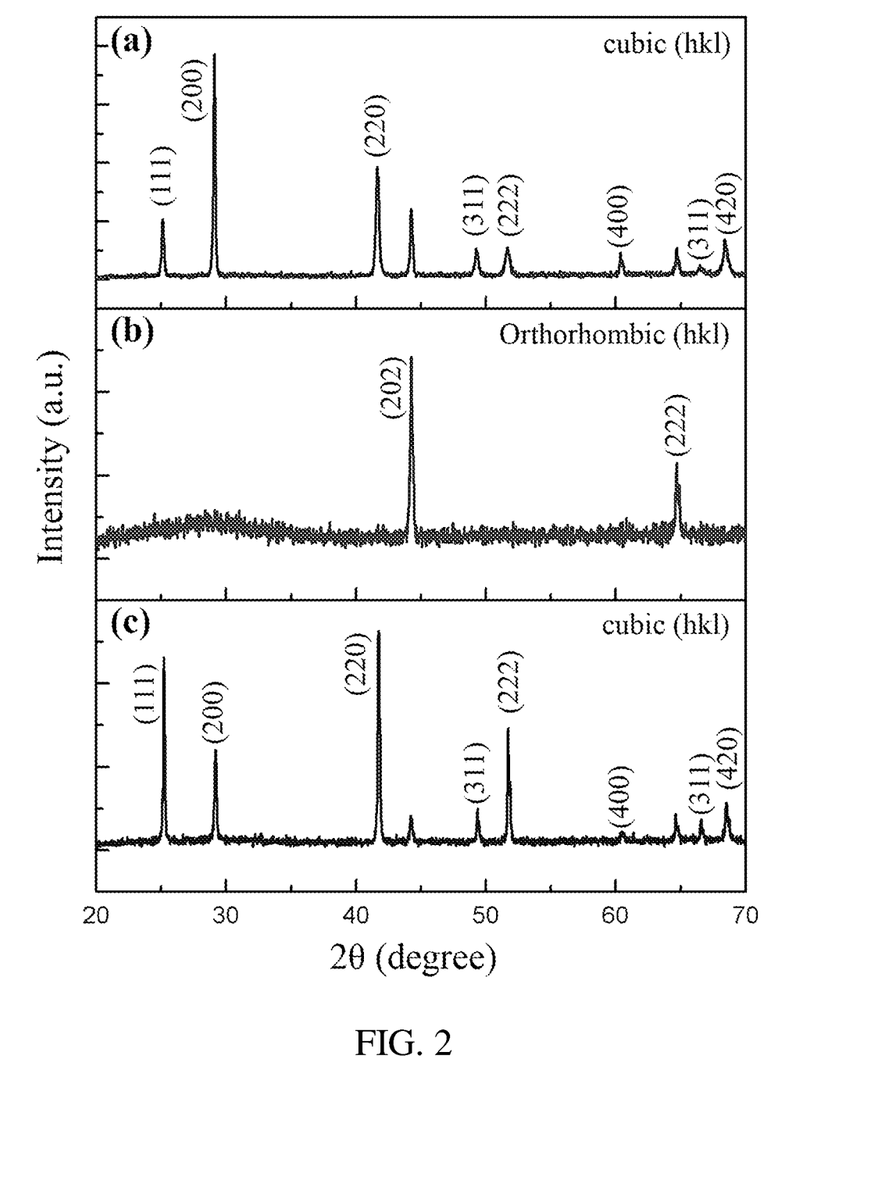
FIG. 2 shows a powder X-ray diffraction diffractogram comparison of PbSe thin film samples prepared by (a) the poly-crystalline high-temperature bath deposition of FIG. 1a, (b) the low-temperature quantum dots deposition method of FIG. 1b, and (c) the modified oriented-attachment nanocrystal growth method of FIG. 1c.

To compare the morphology differences, three PbSe thin films were deposited on glass substrates using different wet chemical growth approaches. Top-view SEM images of the three PbSe thin films are shown in FIG. 1. These samples have clearly showen very distinctive micro-structural formations. FIG. 1(a) shows a PbSe film prepared by the conventional chemical bath deposition method which is typically used for the fabrication of MIR photoconductive detectors. As shown, the film is composed of micro-scale cubic crystal grains with a random distribution of crystal orientations. This growth process was controlled under a high pH value (i.e., ≥12) and high temperature (i.e., ≥60° C.) solution environment. As mentioned previously, a high hydroxyl ion ($OH^{-1}$) concentration could slow down the formation of solid lead hydroxide nanocrystal clusters in the solution, and at the same time, a high growth temperature could activate the direct growth of PbSe nanocrystals on a glass substrate through the ion-by-ion mode. Because the substrate is an amorphous glass, there is no orientation selection related to the substrate which causes the random oriented morphology. Powder XRD measurement presented in FIG. 2(a) also indicate that the PbSe film has multiple orientation indices in the cubic form. Additionally, it is noted that (200) is the strongest peak as opposed to others, which could be attributed to the lowest surface energy of PbSe's (100) crystal plane that makes the (100) facets easier to attach to the substrate. Generally, it has been pointed out that photonic waveguide design requires a much smaller material roughness as opposed to the targeted wavelength range. Because of that, although this approach may be suitable for detectors considering a large roughness could increase the lateral scattering and harvest more photons, it unfortunately cannot serve the purpose for creating photonic waveguides.

FIG. 1(b) demonstrates a conventional cluster-mode dominating procedure to grow the PbSe thin film on a glass substrate. The key parameter different from the first method is the growth temperature. While keeping the same pH concentration, in this process, the growth temperature was controlled between 10° C. to 40° C. Such a low temperature environment could hardly activate the ion-by-ion growth mechanism, and thus severely limits the direct cubic deposition on substrates. Consequently, the cluster mode played the major role leading to the deposition of a quantum dots stacking films on the glass substrate. XRD diffractogram in FIG. 2(b) also can verify that cluster quantum structures are of orthorhombic form rather than the cubic nanocrystals. By referring to the SEM image, it is clear that the surface roughness using this method can be reduced significantly down to a sub-50 nm scale. From this point of view, the method may be good for the photonic design. However, PbSe quantum dots grown in such a low temperature environment are mostly in the early crystallization phase having ultra-small orthorhombic shapes. Their energy band gaps typically fall in the visible to the near-IR range, which doesn't match with the photonic design intention in the mid-IR spectral range desired herein.

To some extent, these two conventional approaches controlling either ion-by-ion or cluster growth mechanisms can both be generally described using the SZM model disclosed in Templeman et al. 2018 (op. cit.). An oriented-attachment method, wherein a transition growth zone was established between the ion-by-ion and cluster growth modes by providing an ultra-high $OH^{-1}$ concentration with a moderately low bath temperature, was then followed. This special synthesizing zone had successfully enabled the oriented growth of PbSe nanocrystals on epi-ready GaAs (100) substrates. However, when other substrates (e.g., glass or silicon wafers) were used, it was found that the growth mechanism failed to be activated. The substrates after the growth still remained almost clear, barely having any film deposited but only a few cubic PbSe crystals scattered on. Such a different phenomenon cannot be explained by the SZM model. Without wishing to be bound by theory, it may be that epi-ready GaAs substrates offer a unique and critically important high-density crystal seeding layer that could reduce the activation threshold of the oriented-attachment mode to a low temperature transition region between ion-by-ion and cluster dominating zones. However, when it comes to other hetero-substrates such as glass or Si wafers, this special activation layer is missing thus cannot lead to the oriented-attachment growth results.

Given these results, a modified oriented-attachment growth procedure was developed that doesn't involve the use of crystalline GaAs (100) substrate. An additional step was used to form a similar seeding layer using an intermediate solution treatment process. In this step, the wafer was wet-coated with an atomic-scale thin PbSe layer in a high temperature but a lower pH value (i.e., pH 10-11) environment. The general guideline is to promote the growth transition from cluster dots to cubic crystal grains. After that, the condition is adjusted to the one described by the standard oriented-attachment method. It was found that such a hybrid procedure can effectively reproduce the oriented growth result without the use of GaAs wafers. As shown in the top-view SEM image in FIG. 1 (c), by applying this modified chemical approach, a similar highly uniformed PbSe (111) oriented nanocrystal thin film layer can been can be successfully created directly on an amorphous glass substrate. Pyramidal tip arrays are revealed clearly in the inset of FIG. 2 (c). At the same time, XRD characterization indicates that the (111) group oriented crystals dominate in the film compared to the (100) group. The (220) peak is considered to result from the tilted pyramidal crystals. This angle randomness is suggested to be attributed to the missing of crystalline substrates. It is emphasized that although the oriented attachment mode dominates, other mechanisms still exist and may lead to the growth of surface contaminant. In at least certain embodiments of the lead salt films, the quantity of (111) oriented crystals predominates over the quantity of (200) oriented crystals.

Figure 3:
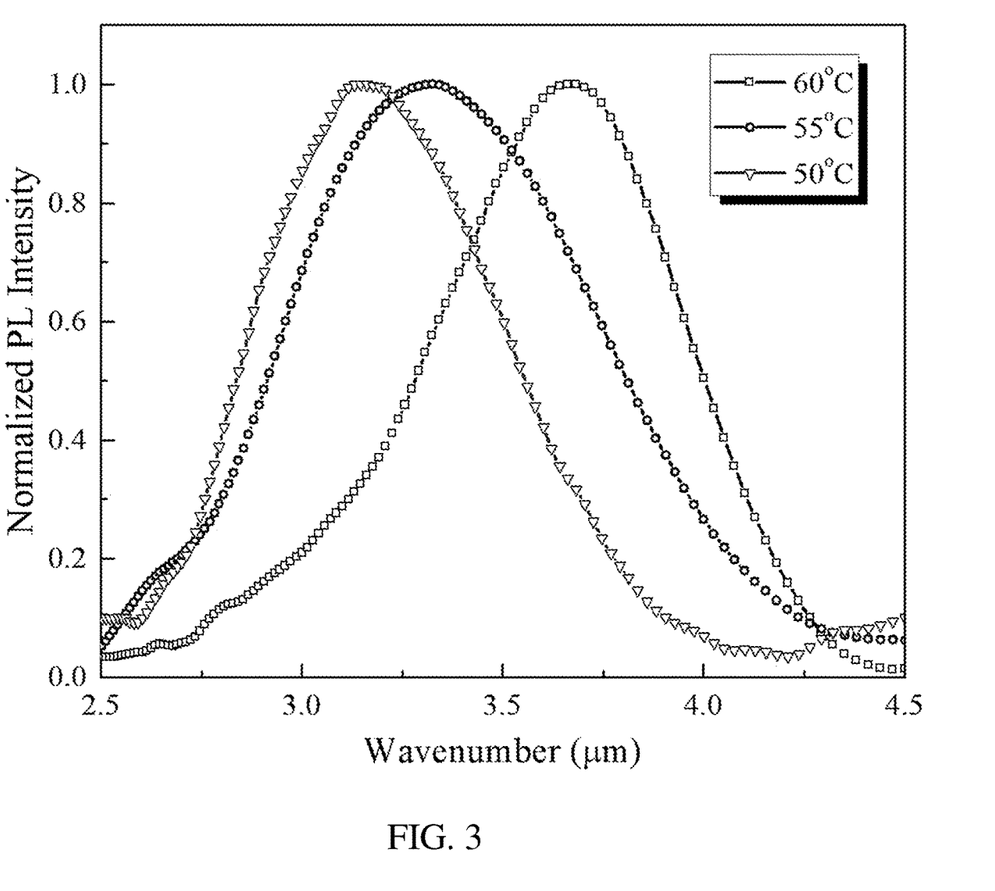
FIG. 3 shows photoluminescence (PL) emission spectra from PbSe films prepared by the modified oriented-attachment method of FIG. 1b at varying deposition bath temperatures.

The (200) group of peaks are thus considered to be from some scattered large crystal contamination due to the minor ion-by-ion process. Lastly, thanks to the large Bohr radius of lead salt semiconductors (i.e., PbSe 46 nm, PbTe 46 nm and PbS 20 nm), quantum confinement effects can be achieved in the MIR spectrum range by controlling the cubic crystal sizes of the PbSe. To demonstrate the quantum effect, the direct bandgap radiative emission of PbSe films was measured using PL as a function of gain size of the pyramidal crystal gains. Results are presented in FIG. 3. A clear transition toward higher band gap energies can be seen by reducing the bath temperature from 60° C. to 50° C. It is notable that the ability to tune the PL emission of the PbSe material in this wavelength range is of special importance since many important gas molecules such as hydrogen sulfide ($H_2S$), the hydrocarbon group (e.g., $CH_4$, $C_2H_5$, etc.) all have strong absorption peaks in between 3-4 μm.

In summary, the present disclosure describes a new method for synthesizing an oriented PbSe, PbS, or PbTe nanocrystal film using a new modified oriented-attachment method. Both the conventional high temperature chemical bath deposition method and low temperature cluster growth method are shown to be ineligible for the photonic waveguide design in the MIR region. Then, the lead salt film prepared by the novel oriented-attachment process is disclosed which offers a highly-smooth top surface with roughness smaller than 100 nm. Further, the film is composed of (111)-oriented PbSe nanocrystal grains whose crystal size can be manipulated to deliver size-dependent quantum confinement effect in MIR wavelength domain, and the film can be directly deposited on any low refractive index substrate. These unique properties offer several new dimensions of design freedoms thus make this film an ideal choice for photonic waveguide engineering in the MIR spectrum.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled may be directly coupled or may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method of manufacturing comprising:
   seeding, using a physical vapor deposition (PVD) process, a substrate with a lead salt solution having a first potential of hydrogen (pH) of 10-12 at a seeding temperature of 560-90 degrees Celsius (C) for 1-5 minutes to form a seeded substrate comprising lead salt seed crystals; and
   growing a lead salt thin film upon the substrate by exposing the seeded substrate to a chemical bath comprising the lead salt solution at a growth temperature of 50-65° C. for 1-15 minutes at a second pH of 10-12.

2. The method of claim 1, wherein the first pH or the second pH is 10-11.

3. The method of claim 1, wherein the seeding temperature is 70-80° C.

4. The method of claim 1, wherein the growth temperature is 50-60 degrees Celsius (° C.).

5. The method of claim 1, wherein the substrate is selected from the group consisting of glass, silicon, oxide on silicon, gallium arsenide (GaAs), indium phosphide (InP), and a metal.

6. The method of claim 1, wherein the lead salt solution comprises lead selenide (PbSe).

7. The method of claim 1, wherein the lead salt solution comprises lead sulfide (PbS).

8. The method of claim 1, wherein the lead salt solution comprises lead telluride (PbTe).

9. The method of claim 1, further comprising further growing the lead salt thin film to comprise first nanocrystals having a (111) orientation that predominate in quantity over second nanocrystals having a (200) orientation.

10. The method of claim 1, further comprising further growing the lead salt thin film to have an emission wavelength of 3-5 micrometers (μm).

11. The method of claim 1, further comprising further growing the lead salt thin film to have an emission wavelength of 3.2-4.2 micrometers (μm).

12. The method of claim 1, further comprising further growing the lead salt thin film to have an emission wavelength of 3.2-4.2 micrometers (μm).

13. The lead salt thin film manufactured by the process of claim 1.

14. A photonic crystal microchip comprising the lead salt thin film of claim 13.

15. A gas sensing device comprising:
- a diode laser;
- a mid-infrared photodetector; and
- a photonic crystal microchip comprising the lead salt thin film of claim 13.

16. A method of detection comprising:
- exposing a gas sample to the gas sensing device of claim 15; and
- determining content of hydrocarbon gases in the gas sample.

17. The method of claim 9, wherein the first nanocrystals have an orthorhombic form.

* * * * *